(12) United States Patent
Schmit

(10) Patent No.: US 7,861,083 B2
(45) Date of Patent: Dec. 28, 2010

(54) HYBRID ENCODING OF DATA TRANSMISSIONS IN A SECURITY SYSTEM

(75) Inventor: Thomas Schmit, Huntington, NY (US)

(73) Assignee: Honeywell International Inc, Morristown, NJ (US)

( * ) Notice: Subject to any disclaimer, the term of this patent is extended or adjusted under 35 U.S.C. 154(b) by 144 days.

(21) Appl. No.: 12/358,464

(22) Filed: Jan. 23, 2009

(65) Prior Publication Data

US 2009/0132826 A1 May 21, 2009

Related U.S. Application Data

(62) Division of application No. 10/891,205, filed on Jul. 13, 2004, now Pat. No. 7,500,105.

(51) Int. Cl.
*H04L 9/32* (2006.01)

(52) U.S. Cl. .................................. 713/170; 713/181

(58) Field of Classification Search .............. 713/168, 713/170, 176, 179, 181; 370/235, 389, 390, 370/241, 230; 714/4, 5, 39, 48, 742, 499; 709/220, 223; 380/255, 31, 42, 37

See application file for complete search history.

(56) References Cited

U.S. PATENT DOCUMENTS

| | | | |
|---|---|---|---|
| 5,828,300 A | 10/1998 | Addy et al. | |
| 6,026,165 A | 2/2000 | Marino et al. | |
| 6,038,607 A | 3/2000 | Hamilton et al. | |
| 6,118,765 A * | 9/2000 | Phillips | 370/235 |
| 6,167,137 A | 12/2000 | Marino et al. | |
| 6,226,742 B1 | 5/2001 | Jakubowski et al. | |
| 6,895,023 B2 | 5/2005 | Fice et al. | |
| 7,043,210 B2 | 5/2006 | Zhu et al. | |
| 7,218,641 B2 | 5/2007 | Kuffner et al. | |
| 7,523,215 B1 * | 4/2009 | Robinson et al. | 709/236 |
| 7,747,018 B2 * | 6/2010 | Marino | 380/262 |
| 2004/0158333 A1 * | 8/2004 | Ha et al. | 700/3 |
| 2005/0111446 A1 | 5/2005 | Greaves et al. | |

* cited by examiner

*Primary Examiner*—Nirav Patel
(74) *Attorney, Agent, or Firm*—Husch Blackwell Welsh Katz

(57) ABSTRACT

A security system in which wireless transmitting security devices use a hybrid or dual encoding methodology, wherein a first part of a data message is encoded in a return-to-zero (RZ) format and a second part of the data message is encoded in a non-return-to-zero (NRZ) format, thereby increasing error detection and correction. In a first aspect of the invention, status information is included in the first part of the message and redundant status information is included in the second part of the message. In a second aspect of the invention, message sequence information is included in the second part of the message to avoid processing of stale or out-of-sequence messages.

20 Claims, 13 Drawing Sheets

HYBRID ENCODING OF DATA TRANSMISSIONS IN A SECURITY SYSTEM

CROSS-REFERENCE TO RELATED APPLICATIONS

This application is a divisional application of and claims the filing benefit of U.S. Ser. No. 10/891,205, filed Jul. 13, 2004.

FIELD OF THE INVENTION

This invention relates to security and other types of networked systems, and in particular to the use of multiple or hybrid data encoding schemes for increased error detection and correction during data transmission in such security systems.

BACKGROUND OF THE INVENTION

Security systems used to monitor premises and determine if the premises has been breached or an alarm condition exists are well known in the art. These systems typically include a control panel, a systems communications medium such as a data bus, and a number of security devices located throughout the premises for performing a certain function in the system. Security devices typically include glass break sensors, smoke detectors, fire detectors, motion sensors, door and window opening sensors, etc. Security devices also include peripherals such as dialers, keypads, display consoles, RF transmitters and receivers, etc. The control panel is typically configured to communicate with the security devices to collect and send information with these devices, such as when a user enters a "system arm" code in the keypad in order to arm the control panel and the security system.

Although security devices have in the past been typically wired to the system control panel, it has been increasingly common to utilize a wireless system wherein the need for a data bus or wired loop is eliminated (in whole or in part) by using radio frequency (RF) communications between components. In particular, it is desirable to use an RF transmitter in conjunction with a security device such as a motion detector to transmit RF signals to an RF receiver located near or integrated with the control panel for effecting wireless communications between the security device and the control panel. The RF receiver may also be interconnected to a wired bus or loop (to which the control panel is attached) so that a wireless link is utilized between the security device and the rest of the (wired) security system.

Data integrity is a particular concern with wireless security systems since there is no wired connection between the security device and the control panel. Methods have been used in the past, such as a cyclic redundancy check (CRC), in an attempt to provide for some error detection and/or correction in data transmissions. It is an object of the present invention to provide an improved methodology for ensuring error-free data transmissions between components of a security system.

SUMMARY OF THE INVENTION

Accordingly, the present invention is a security system that has security devices that wirelessly communicate with a control panel via a receiver. Each security device has an associated RF transmitter. First, a two-part data message is formed at the security device/transmitter, having a first message part and a second message part. The first message part includes a preamble portion, an identification number portion that uniquely identifies the security device, a status portion that comprises status or message data indicative of the status of the security device, and a CRC portion that contains CRC data based on a CRC function performed on the identification number portion and the status portion. The second message part may include different types of data, depending on the desired functionality, as described herein. The first message part is encoded using a first encoding format (which is typically return-to-zero (RZ) format), and the second message part is encoded in a second encoding format different from the first encoding format (which is typically non-return-to-zero (NRZ) format). A carrier signal is then modulated (such as by amplitude modulation) with the encoded first message part and the encoded second message part, and the modulated carrier signal is transmitted.

In a first aspect of the present invention, the second message part includes a first redundant status portion that repeats the status data from the first message part, and a second redundant status portion that also repeats the status data from the first message part, but is the logical inverse of the first redundant status portion. A receiving device, such as a stand-alone receiver or a receiver integrated with a control panel, receives the transmitted signal and demodulates it accordingly. The receiving device then decodes the first message part using the first encoding format (RZ) to obtain the preamble portion, the identification number portion, the status portion, and the CRC portion. The second message part is decoded using the second encoding format (NRZ) to obtain the first redundant status portion and the second redundant status portion.

Processing circuitry is then used to analyze the received data, in particular to analyze two or more of the status portion, the first redundant status portion, the second redundant status portion, and the CRC portion, in order to determine if the message has been validly received. For example, in a relatively straightforward approach, the status portion is compared to the first redundant status portion; and if the status portion is the same as the first redundant status portion, then the message is flagged as being validly received. In the alternative, the status portion may be compared to the second redundant status portion; and if the status portion is the same as the second redundant status portion, then the message is flagged as being validly received. Likewise, the status portion may be compared with the first redundant status portion and the second redundant status portion; and if all are the same, then the message is flagged as being validly received.

More sophisticated scenarios may be followed if desired. For example, a CRC may be generated based on the identification number portion and the status portion; and the generated CRC may be compared to the CRC portion from the received message. If the generated CRC is the same as the CRC portion from the received message, then the message is flagged as being validly received. If, however, the generated CRC is not the same as the CRC portion from the message, then further analysis may be done, wherein the status portion may be compared with the first redundant status portion and the second redundant status portion; and if they are the same, then the message is flagged as being validly received. Other analysis scenarios utilizing these received message parts are described herein.

In a second aspect of the present invention, the second message part includes sequence information that is indicative of the relative sequencing of messages from the security device to assist the receiving device (e.g. the control panel) in determining if the message has been received out of order and should be ignored. In particular, the second message part includes a first sequence count and a second sequence count that has the same information as the first sequence count but is the logical inverse thereof. The receiving device as described above decodes the first message part using the first encoding format (RZ) to obtain the preamble portion, the identification number portion, the status portion, and the CRC portion. The second message part is decoded using the second encoding format (NRZ) to obtain the sequence count. Processing circuitry is then used to analyze the received data, in particular to compare the sequence count from the message with a previous sequence count from memory. If the sequence count from the message is less than or equal to the previous sequence count, then the message is ignored. If, however, the sequence count from the message is not less than or equal to the previous sequence count, then the message is processed and the previous sequence count is replaced in memory with the sequence count from the message. The sequence count and the inverse sequence count are both analyzed with respect to each other to ensure data integrity.

DETAILED DESCRIPTION OF THE INVENTION

Figure 1:
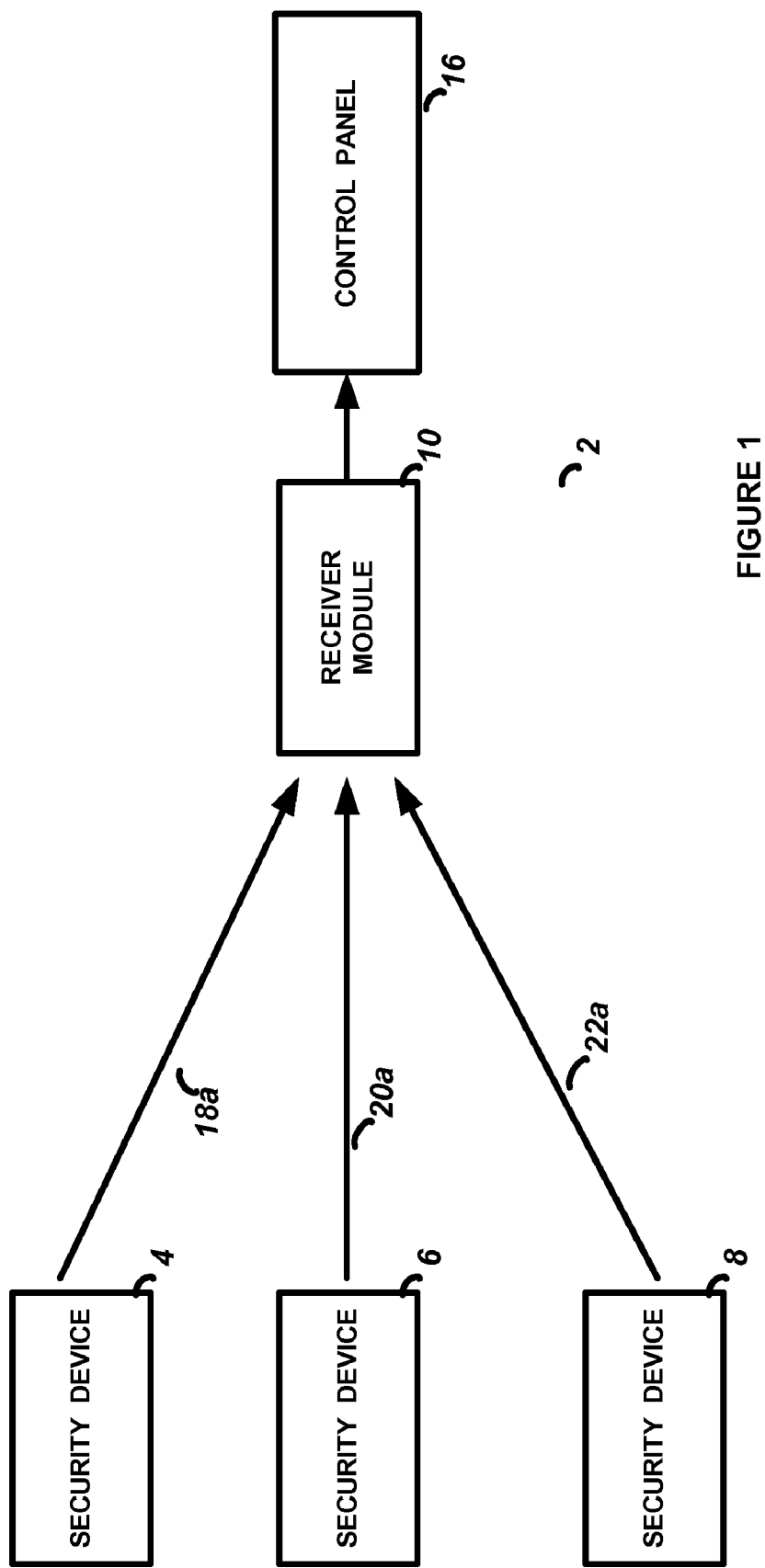
FIG. 1 is a block diagram of a typical security system.

The preferred embodiment of the first aspect of the present invention is now described with reference to the Figures. FIG. 1 illustrates a typical security system 2 that includes a number of security devices 4, 6, 8, each of which send RF data transmissions 14, 16, 18 to a receiver module 10 and associated control panel 12 as known in the art. As previously indicated, the security devices 4, 6, 8 may be any device that is used in a security system, including but not limited to glass break sensors, smoke detectors, fire detectors, PIR motion sensors, microwave motion sensors, door and window opening sensors, dialers, keypads, display consoles, and the like. The security device may also be a gateway, adapter or interface between the control panel and another device. For example, it is common to have an RF receiver connected to a wired communications bus (or loop) to which the control panel is connected. The RF receiver receives messages from another security device such as a wireless PIR sensor (there may also be an RF transmitter for sending messages to the wireless PIR sensor). In this case, both the RF receiver (and/or RF transmitter) as well as the wireless sensors are considered to be security devices in the scope of this invention.

The control panel 12 acts as the system controller for the security system and provides for various functions such as arming and disarming the system, supervising security devices, accepting messages from the security devices to determine if an alarm condition exists, causing an alarm to sound, etc. The receiver 10 may be separate from or integrated with the control panel 12. Moreover, processing and analysis of received data messages as described herein may be undertaken in the receiver 10 or in the control panel 12, as configured by the system designer.

Figure 2:
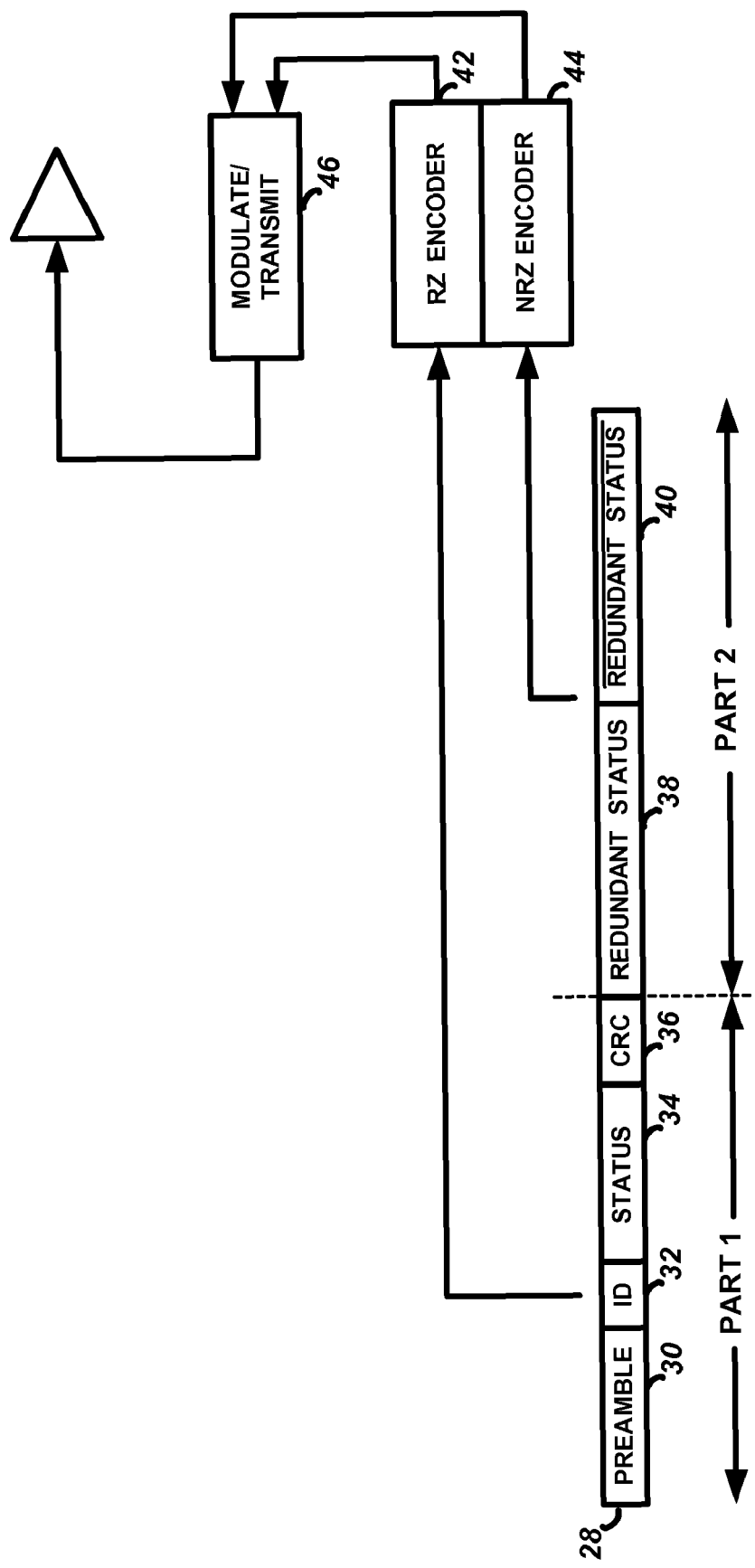
FIG. 2 is a block diagram of the data message processing at the transmitter of a first aspect of this invention.

The security devices may have integrated RF transmitters, as in the preferred embodiment, or such transmitters may be separate from the security device (but in close proximity and wired thereto). FIG. 2 illustrates the functionality of the security device with an integrated RF transmitter. A data message 28 that is to be sent to the control panel is formed and consists of two main parts. Part 1 of the data message 28, as shown in FIG. 2, is similar to what is known in the art and includes a preamble portion 30, an identification portion 32 (which uniquely identifies the security device such as a serial number), a status portion 34, and a CRC portion 36. The status portion 34 includes bits that are of main interest to the control panel, and includes bits that indicate operating status of the security device, battery level, etc. The CRC is generated as known in the art as a function of the ID portion 32 and the status portion 34, and has been previously used as a means of error detection by the receiver/control panel. The present invention improves on the use of just the CRC as further described herein.

A second part of the message is formed under this invention and is shown in FIG. 2 as part 2 of the message 28. Part 2 includes a first redundant status portion 38, which is simply the same data as the status portion 34 in part 1. Part 2 also includes a second redundant portion 40, which also carries the same information as the status portion 34 of part 1, but which is the logical inverse of the first status portion 38. By inverting the second redundant status portion 40, a constant average amplitude is maintained over the entire second part of the message (e.g. when amplitude modulation is used). That is, if the status portion 34 (and the first redundant status portion 38) is for example 1101101000101010, then the second redundant status portion will be 0010010111010101.

Figure 4:
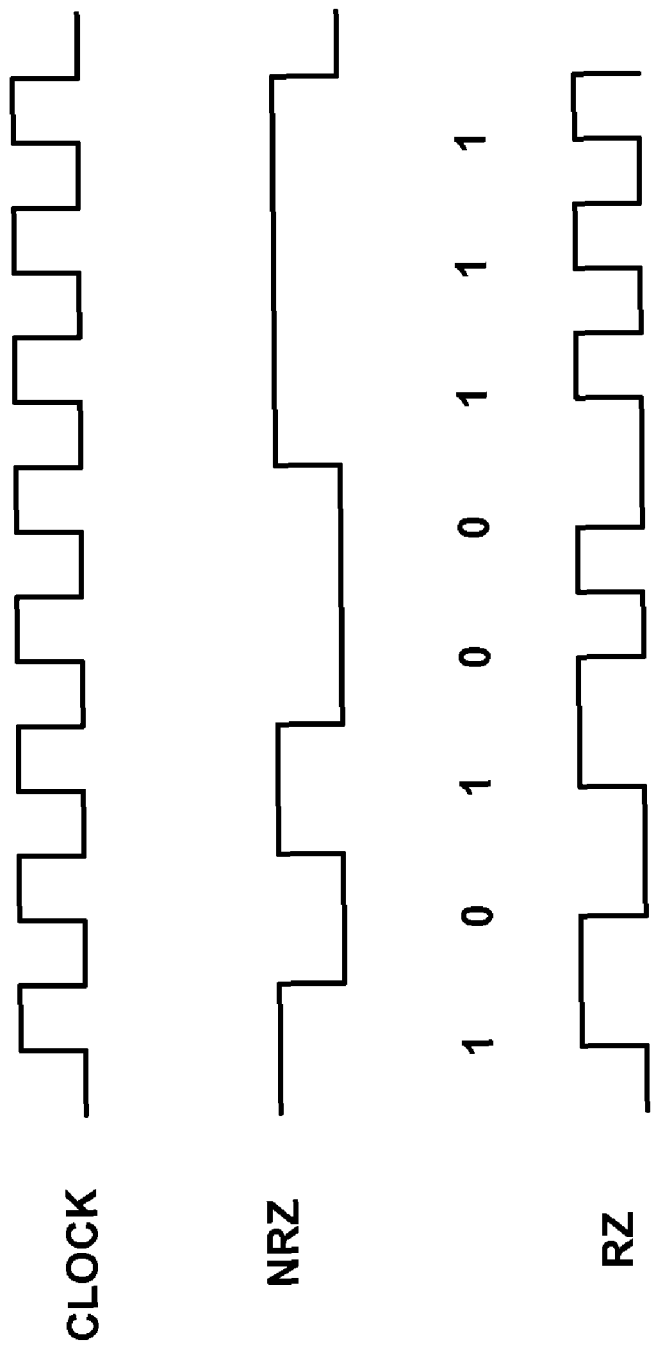
FIG. 4 is an illustration of an RZ and an NRZ data format as used in this invention.

The data message 28 is then encoded for transmission as follows. Part 1 of the message is encoded in a return-to-zero format (RZ) with RZ encoder 42, and part 2 of the message is shown in a non-return-to-zero format (NRZ) with NRZ encoder 44. The RZ format, as illustrated on the left side of FIG. 4, is also known as the Manchester encoding method (Manchester encoding is defined as a code in which (a) data and clock signals are combined to form a single self-synchronizing data stream, (b) each encoded bit contains a transition at the midpoint of a bit period, (c) the direction of transition determines whether the bit is a "0" or a "1," and (d) the first half is the complement of the true bit value and the second half is the true bit value.) The NRZ format, shown on the right side of FIG. 4, does not require the data signal to return to zero between bits. Thus, the logic 1 is shown as a positive voltage and the logic 0 is shown as a zero voltage. In the NRZ format, the signal is not self-clocking as with the RZ format. However, by encoding the second part of the message with the NRZ format immediately after the first part of the message that uses RZ encoding, the clock that has been derived from the RZ portion may be extrapolated and used for clocking the data in the NRZ portion. This may not be feasible if the signal was encoded completely in the NRZ format since there would be no clock available.

Moreover, because it conveys less timing information, the use of the RZ technique minimizes the additional transmission ("on air") time and the channel bandwidth required to convey the redundant status information in the second part of the message. In addition, the use of the RZ encoding complements the NRZ encoding. Due to its symmetrical and redundant structure, the RZ-encoded first part of the message provides improved decoding performance relative to NRZ under certain channel conditions and vice versa. The same advantage applies to the differences in decoding methods between RZ and NRZ as described below.

These are two examples of the RZ and the NRZ formats that may be used in the present invention. Other types may also be used and still provide the benefits described herein.

After the data has been encoded as described, the data stream is used to modulate an RF carrier signal and is transmitted as known in the art. For example, an amplitude modulation (AM) scheme may be employed as known in the art.

Figure 3:
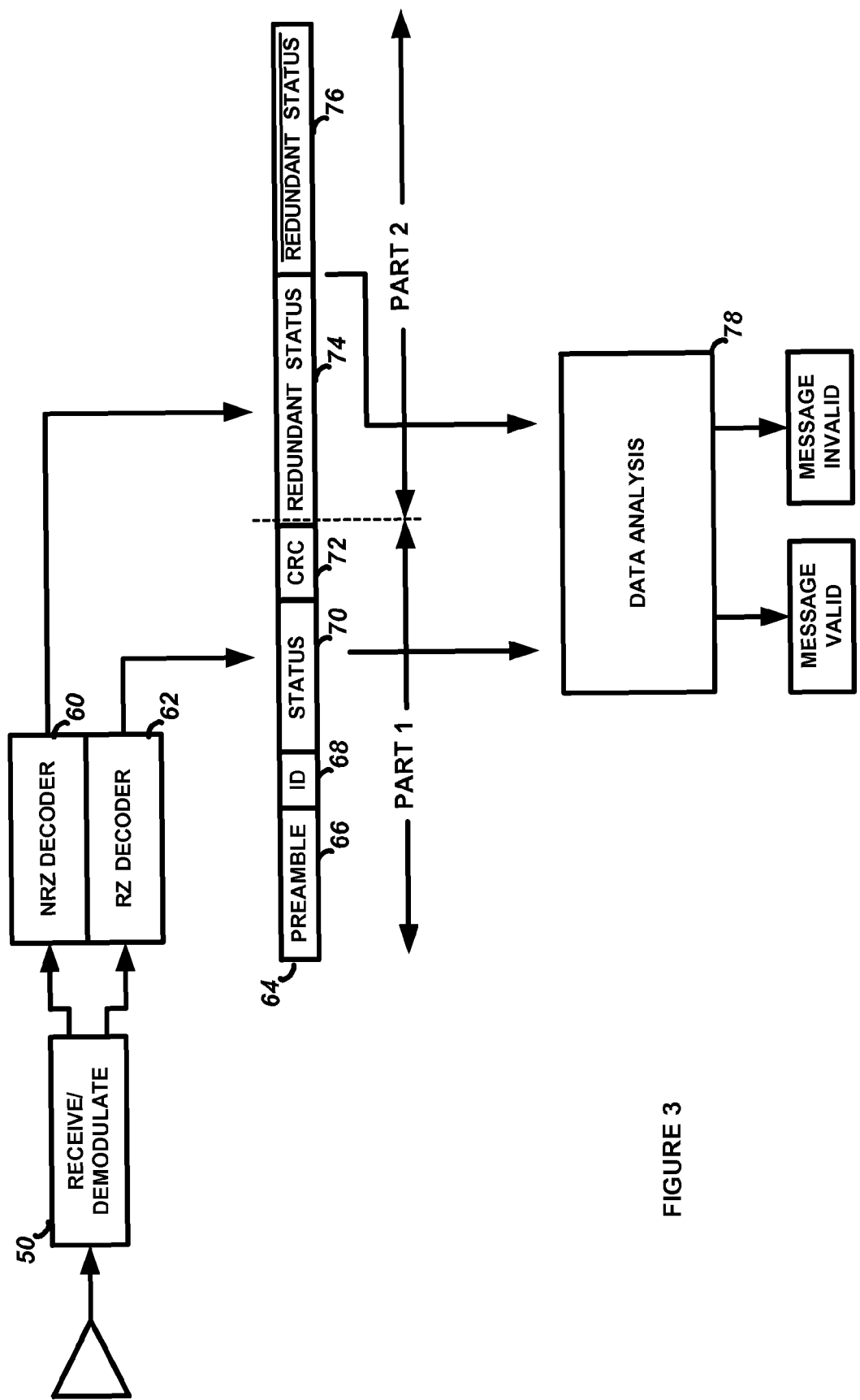
FIG. 3 is a block diagram of the data message processing at the receiving device of a first aspect of this invention.

The modulated signal is received and demodulated by the receiving device, as shown in FIG. 3 and as well known in the art. The signal is then decoded using the RZ decoder 62 and the NRZ decoder 60 to obtain the received data message 64, as shown in FIG. 3. Next, an analysis of the received message 64 is undertaken in order to ascertain if the signal was accurately received and should be further processed as a validly received message. Data analysis block 78 will use the status portion 70, the CRC portion 72, the first redundant status portion 74, and the second redundant status portion 76 in one or more various manners to ascertain the validity of the received message 64. FIGS. 5A-5F illustrate the flow of analysis used in the present invention.

Figure 5A:
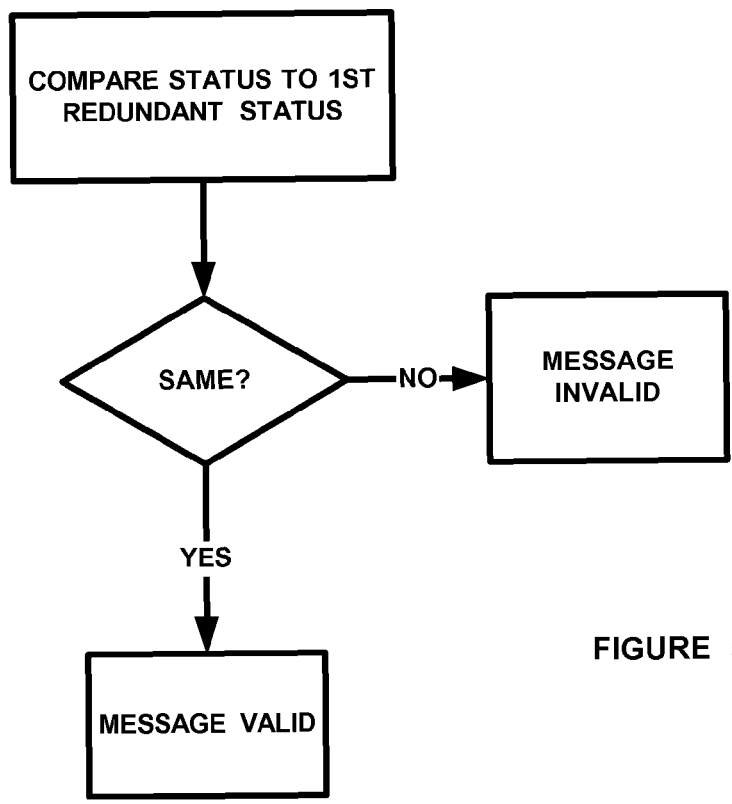
FIGS. 5A, 5B, 5C, 5D, 5E, and 5F each illustrate alternative data analysis flowcharts used in the first aspect of this invention.
Figure 5B:
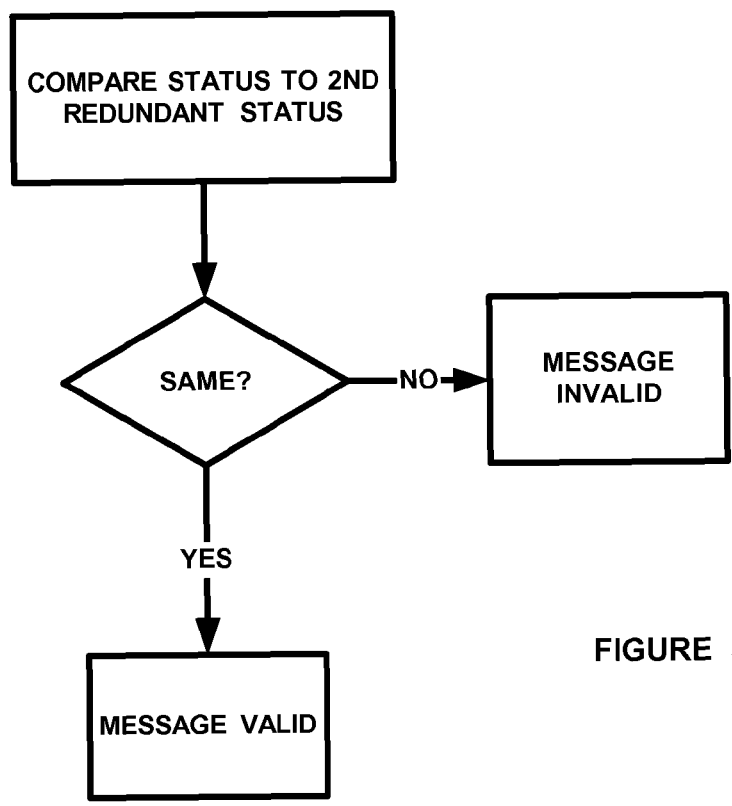
Figure 5C:
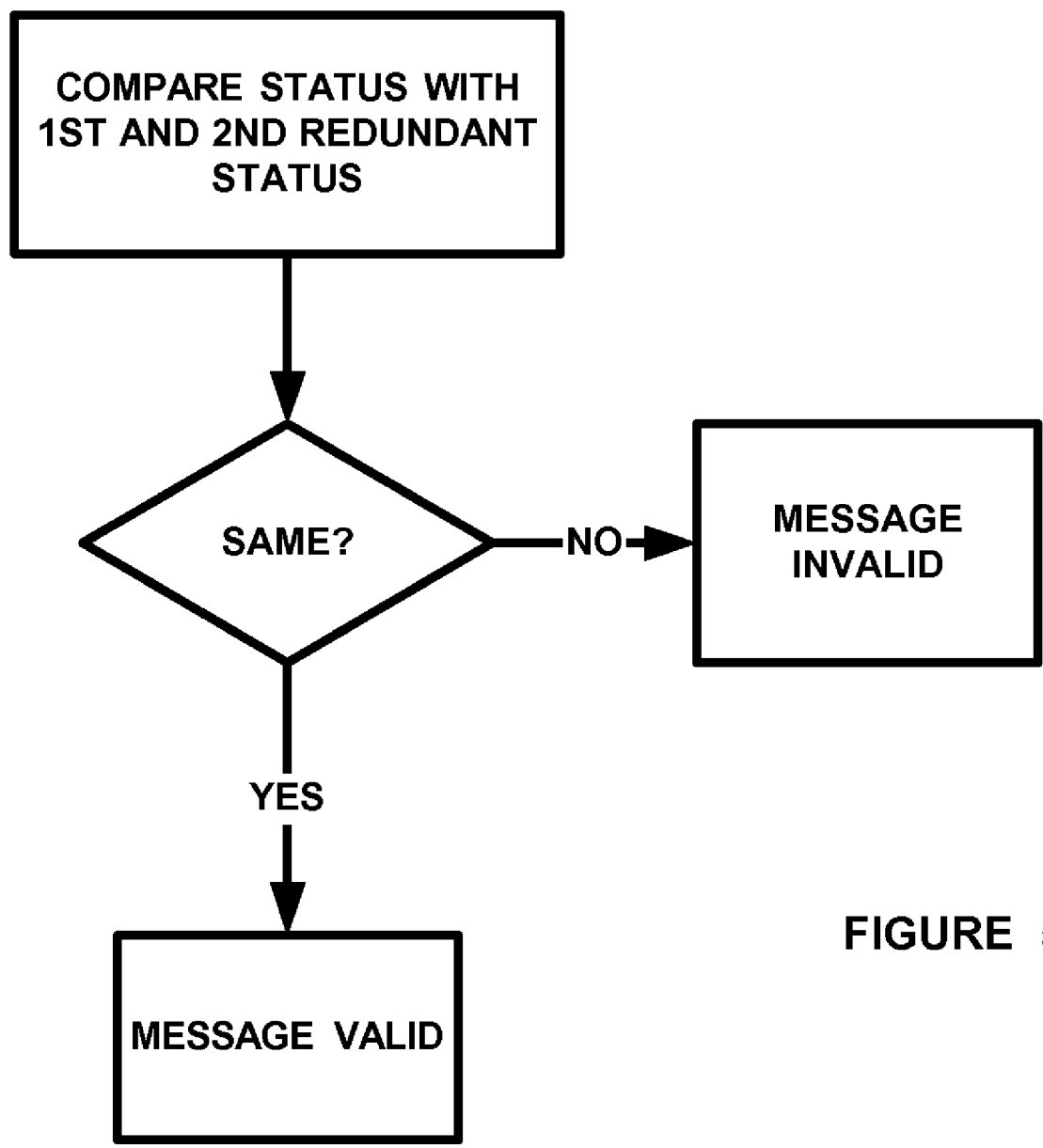

FIG. 5A illustrates how the status portion 70 is compared to the first redundant status portion 74. If the status portion 70 is the same as the first redundant status portion 74, then the message 64 is flagged as being validly received. In the alternative, as shown in FIG. 5B, the status portion 70 may be compared to the second redundant status portion 76. If the status portion 70 is the same as the second redundant status portion 76, then the message is flagged as being validly received. Likewise, as shown in FIG. 5C, the status portion 70 may be compared with the first redundant status portion 74 and the second redundant status portion 76, and if all are the same, then the message is flagged as being validly received.

Figure 5D:
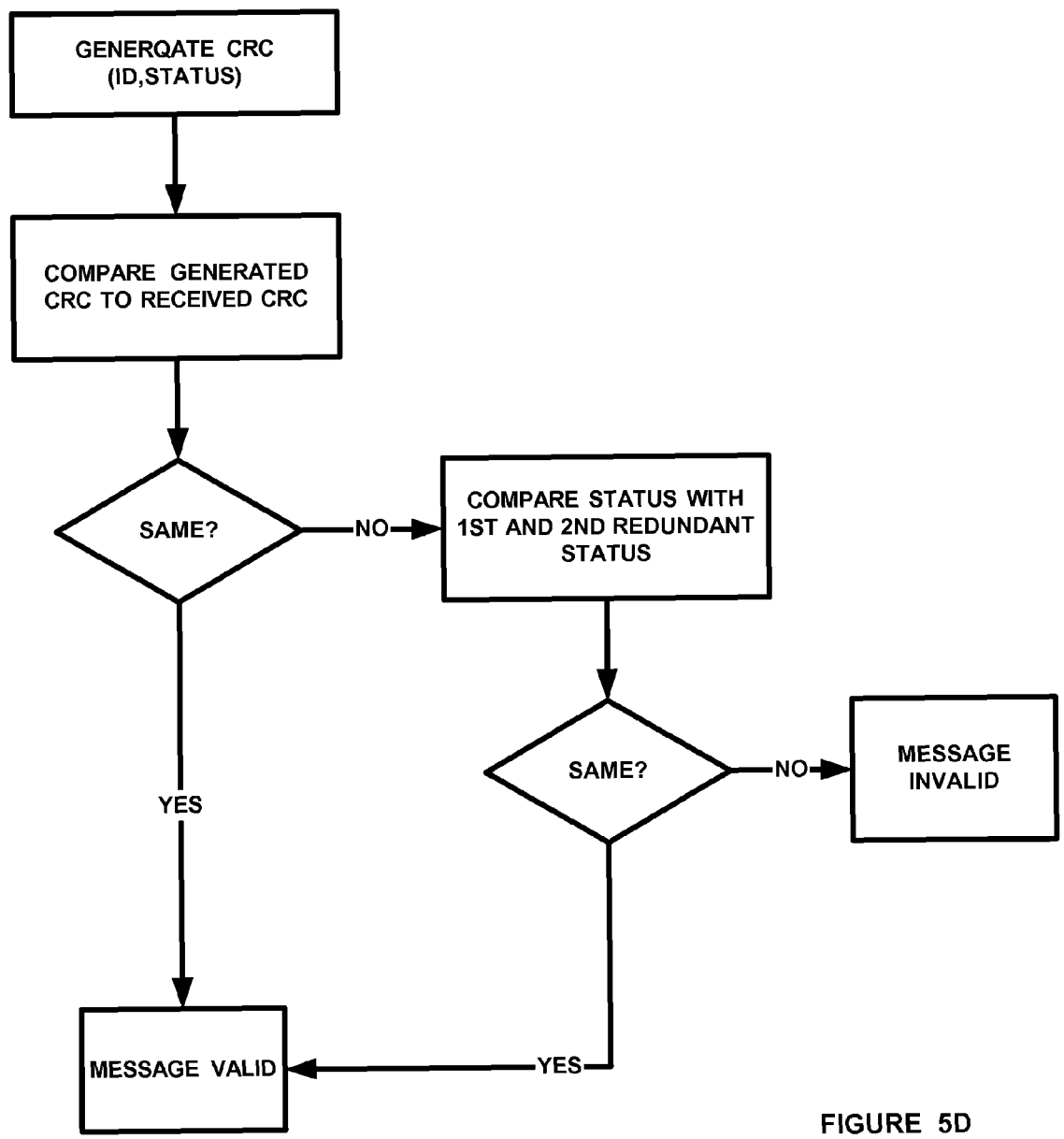

More complicated scenarios may be followed if desired. For example, as shown in FIG. 5D, a CRC may be generated based on the identification number portion 68 and the status portion 70; and the generated CRC may be compared to the CRC portion 72 from the received message 64. If the generated CRC is the same as the CRC portion from the message, then the message is flagged as being validly received. If, however, the generated CRC is not the same as the CRC portion from the message, then the status portion may be compared with the first redundant status portion and the second redundant status portion; and if they are the same, then the message is flagged as being validly received.

Figure 5E:
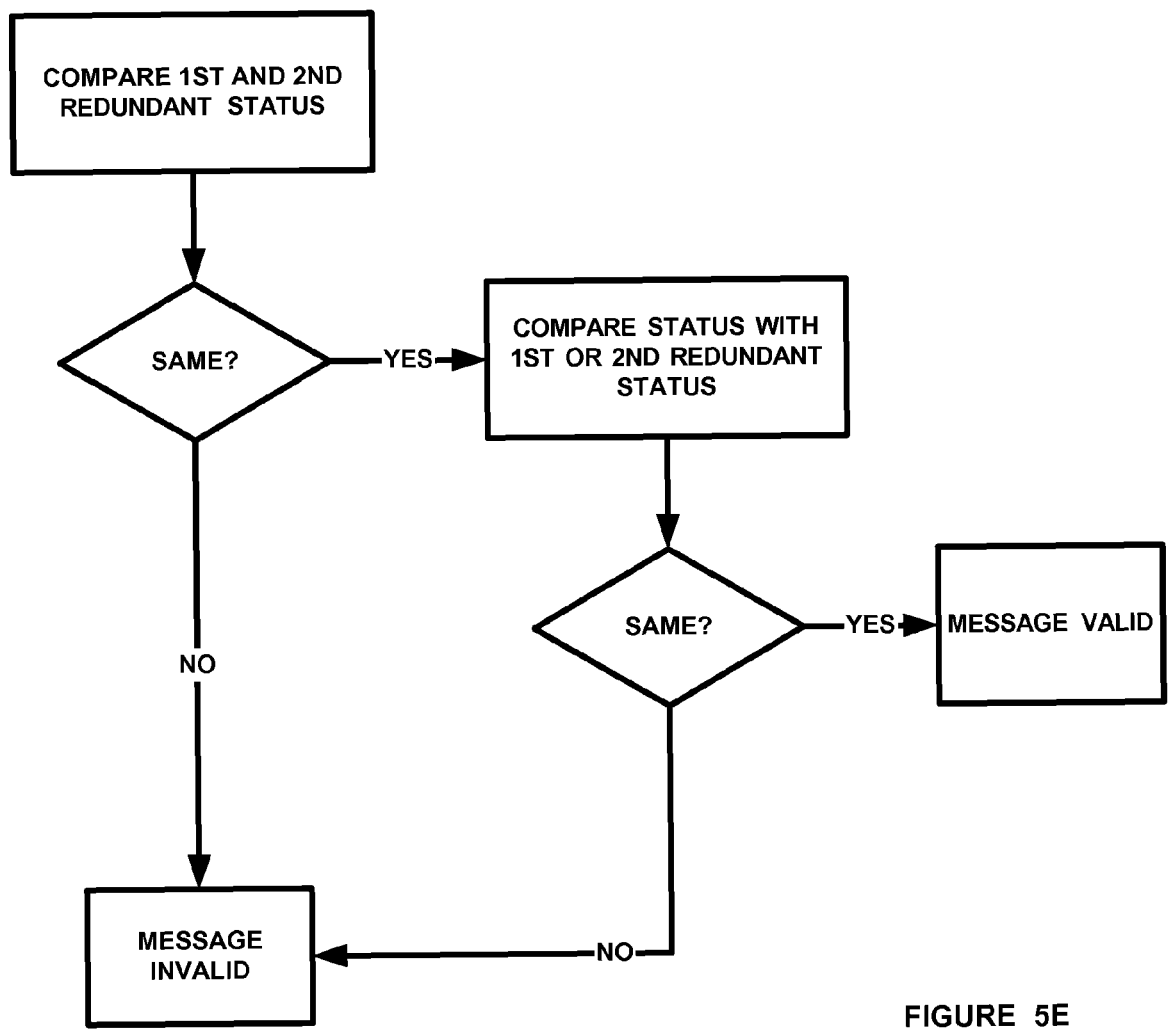

FIG. 5E illustrates a further example of the analysis performed by analysis block 78. First, the first redundant status portion 74 and the second redundant status portion 76 are compared, and if they are the same, then they are compared with the status portion 70. The message is flagged as being validly received when this comparison passes.

Figure 5F:
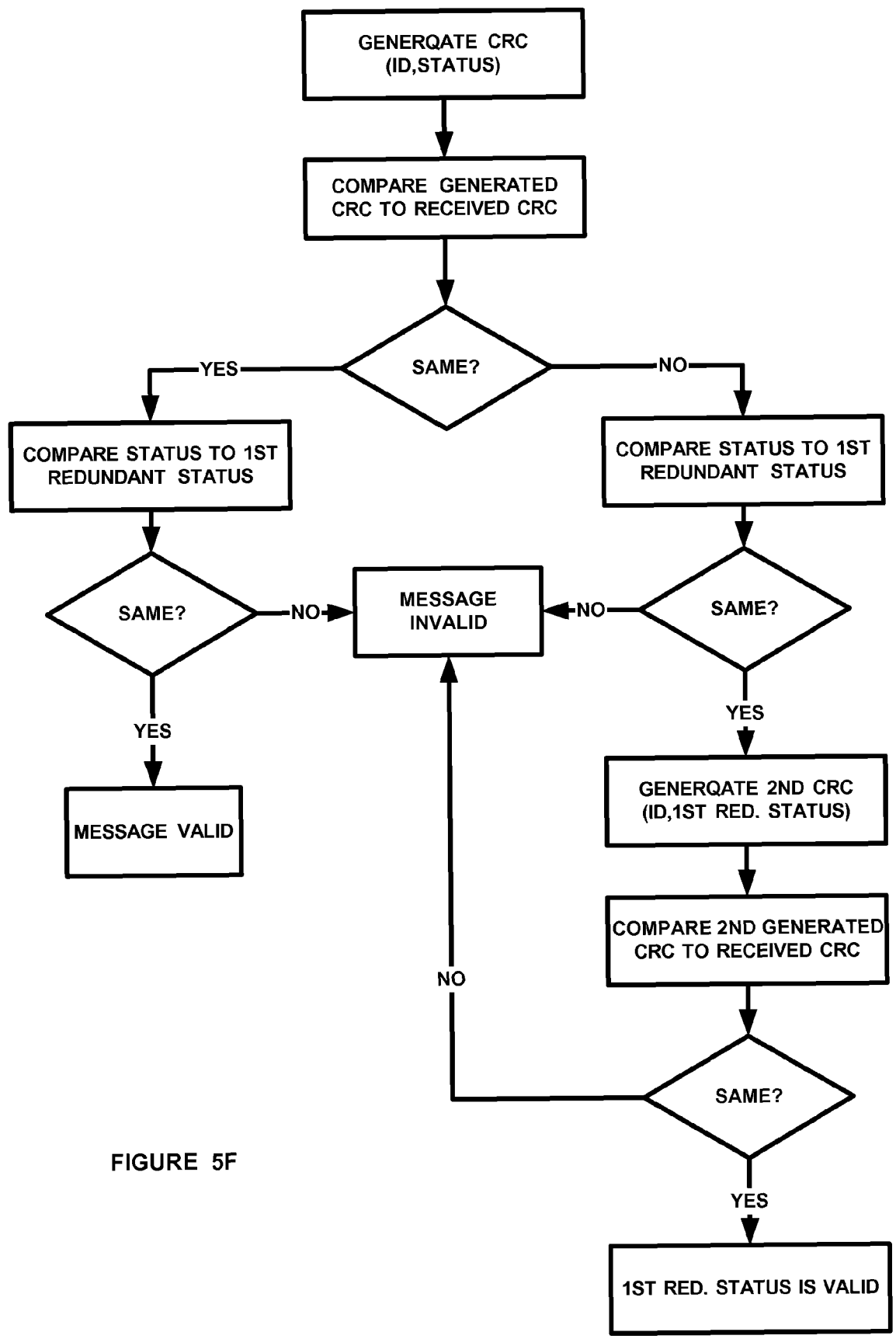

FIG. 5F illustrates another example of data analysis. First, a CRC is generated based on the identification number portion 68 and the status portion 70. The generated CRC is compared to the CRC portion 72 from the received message. If they are the same, then the first redundant status portion 74 is compared to the second redundant status portion 76, and if they are the same, then the message is flagged as being validly received. If, however, the generated CRC is not the same as the CRC portion 72 from the message, then the first redundant status portion is compared to the second redundant status portion, and if they are the same, then a second CRC is generated based on the identification number 68 and the first redundant status portion 74, the second generated CRC is compared to the CRC portion 72 from the message, and if the comparison passes, then the first redundant status portion is used as a validly received status portion (if the comparison fails, then the message is flagged as being invalidly received).

Thus, due to the presence of the redundant status information, the receiving device can make a determination as to the accuracy of the received message and proceed accordingly (e.g. use the message or discard it). By embedding the redundant information in a second portion of the message that is encoded in a different format than the first portion, a robust transmission methodology is achieved that will provide for a greater chance of accurate transmission in varying environments where one encoding methodology may perform better that the other.

Referring to FIGS. 6, 7, 8 and 9, the second aspect of the invention utilizes the same hybrid-encoding scheme of the first aspect of the invention, but instead of transmitting redundant status data in the second message part, message sequence information is transmitted. In accordance with this second aspect of the invention, problems associated with having multiple receivers receiving messages from the same transmitter at different times is addressed. If an installation requires that more than two RF receivers must be distributed in strategic locations throughout the system and connected to a single security control via a single communication bus, the use of sequence information in the transmitted signal will permit the control panel to properly process the received signals. To clarify this point, assume an eight bit sequence number contained within the transmitted signal information which is advanced one increment in a given transmitter each time the transmitter has to transmit a new event. The new event may be the opening of a door or the closing of that same door. Assume further that it takes 2-4 seconds for the transmitter to repeat the required number of identical "opening" or "closing" messages per event. If the door is opened and closed within the 2-4 second time interval, it is possible for the control panel to receive the opening and closing reports from one RF receiver and only the opening report from another receiver which may be in marginal range from the given transmitter. Without a sequence count included as part of the transmitted events, the control could erroneously determine the final state of the door to be open rather than closed if it processed the initial opening event from the second receiver after processing the closing event from the first receiver. The larger the number of receivers used on the common control bus the greater would be the probability of this type of control error. With a sequence count included in the transmitted messages as in the present invention, the count of the opening event would be lower than that of the closing event, since the opening event preceded the closing event, indicating to the control that the final state of that door must be closed.

Figure 6:
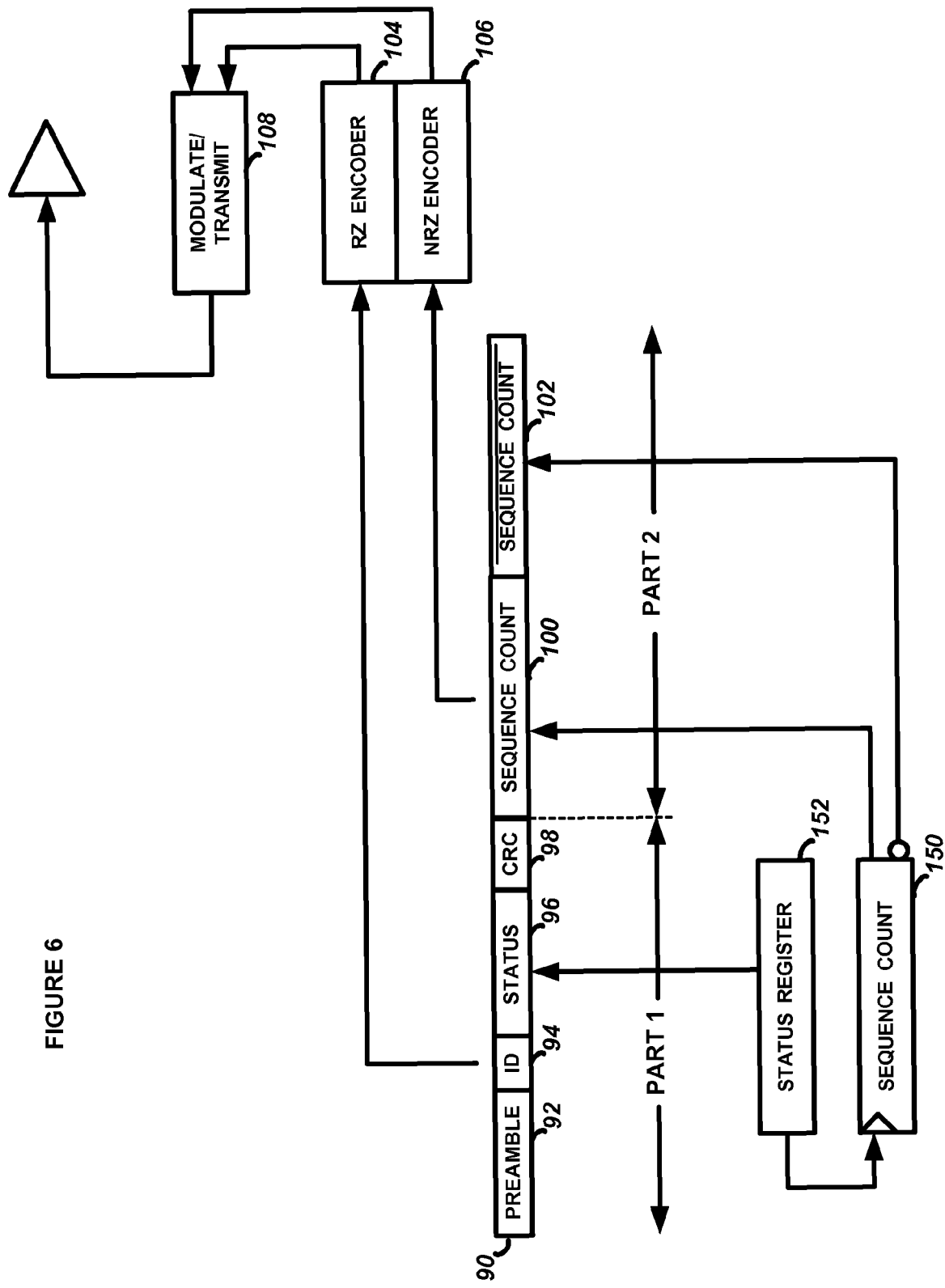
FIG. 6 is a block diagram of the data message processing at the transmitter of a second aspect of this invention.
Figure 8:
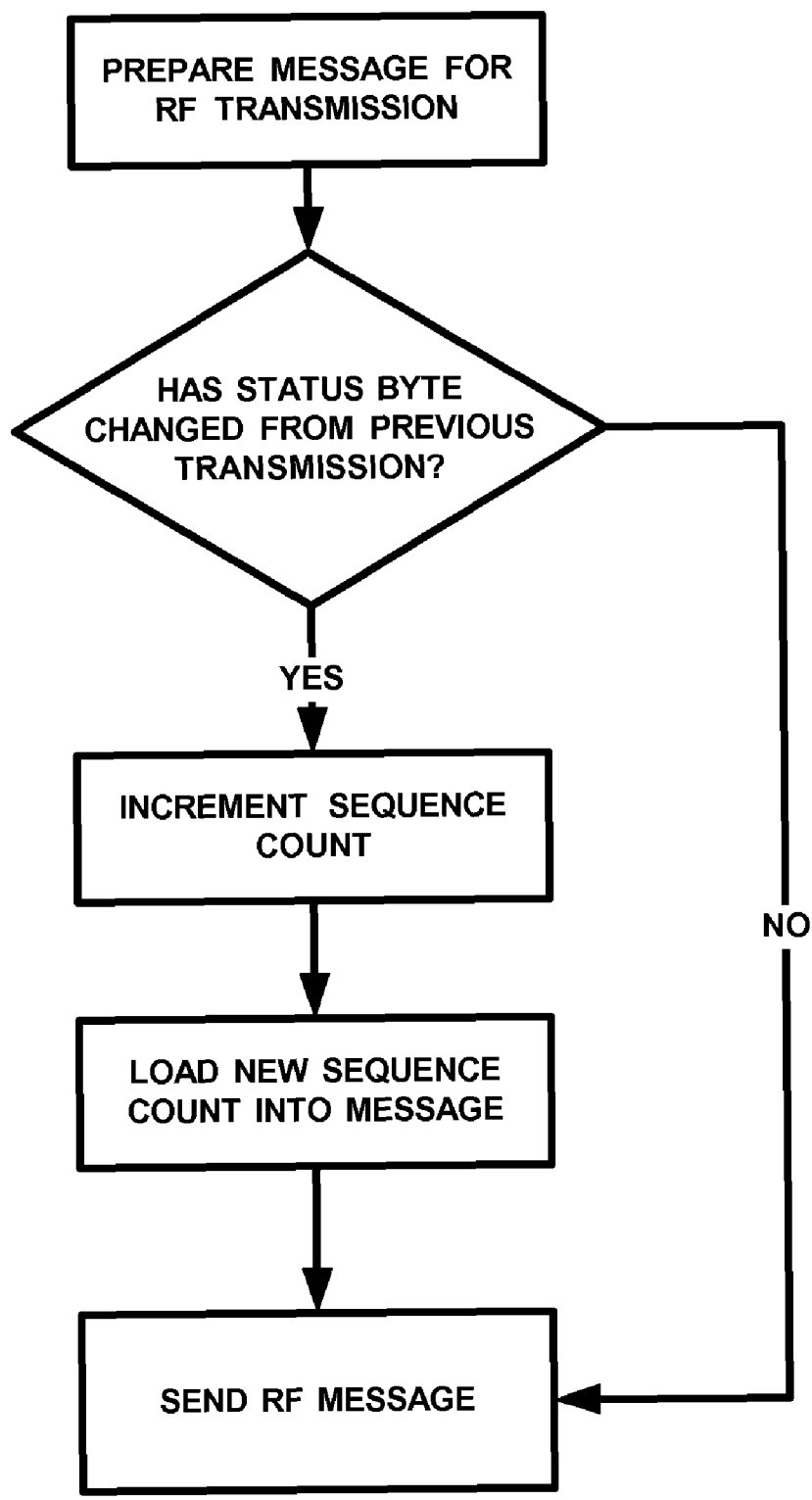
FIGS. 8 and 9 are flowcharts of the operation of the second aspect of this invention.

Referring to the transmitter block diagram of FIG. 6 and to the logic flowchart of FIG. 8, a sequence count register 150 is used to provide a transmission sequence count, which is incremented with each new transmission event (identified by the message in which at least one bit in the status register 152 has changed from the previous transmission). Thus, logic associated with the status register 152 will increment the sequence counter 150 when any bit has changed. The preamble 92, status bits 96, the identification number (serial number) 94 and the CRC 98 are assembled along with the sequence count 100 and the inverse sequence count 102 into the two-part message that is processed by the RZ encoder 104 and the NRZ encoder 106 as previously described. Thus, by incrementing the sequence counter 150 whenever a status bit has changed, the control panel can determine if a message has been received out of sequence from a given transmitter as described herein.

After encoding the first part of the message in RZ format and the second part of the message (the sequence information) in NRZ format, the message is transmitted. Of course, each security device/transmitter in the system will likely have different sequence counts at any given time since each operates asynchronously from each other. As described below, the receiving device (control panel) will track the sequence count for each transmitter individually to determine the proper sequencing for each transmitter.

Figure 7:
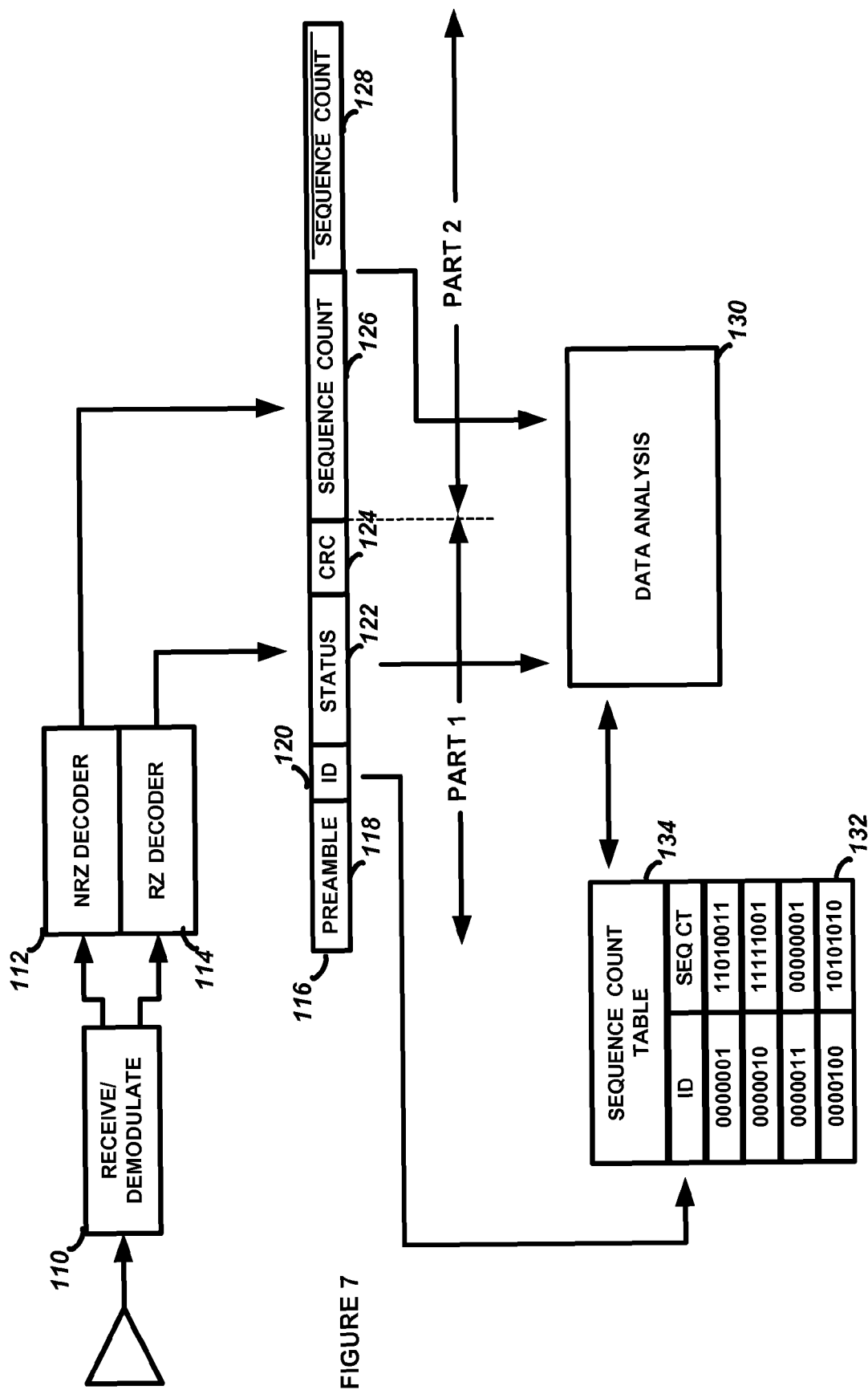
FIG. 7 is a block diagram of the data message processing at the receiving device of the second aspect of this invention.
Figure 9:
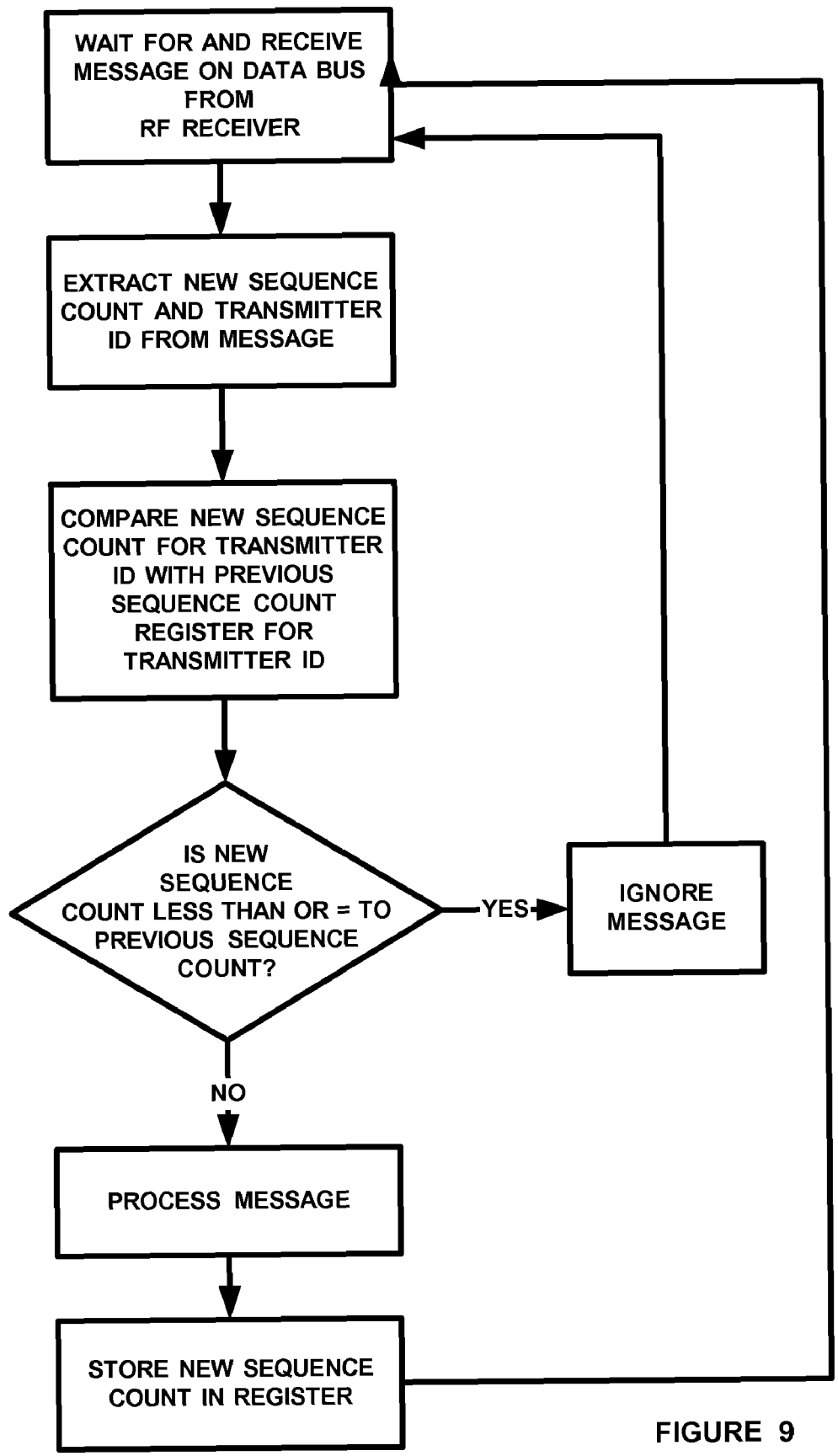

As shown in FIGS. 7 and 9, the receiving device receives and demodulates the wireless message, and then proceeds to decode the message with the RZ decoder 114 and NRZ decoder 112 as previously described. The data analysis circuitry and logic then processes the message by first extracting the sequence count 126 and inverse sequence count 128 and the transmitter identification number from the message. A previous sequence count associated with the transmitter identification number is retrieved from a sequence count table 134 in memory. The sequence count 126 from the message is compared with the previous sequence count retrieved from the table. If the sequence count from the message is less than or equal to the previous sequence count, then the receiving device ignores the message and takes no further action. If, however, the sequence count from the message is not less than the previous sequence count, then the receiving device processes the message (i.e. the status portion) and replaces the previous sequence count in the table with the sequence count from the message. As with the first embodiment previously described, the inverse sequence count 128 is also used if desired as a check on data integrity.

As such, if a message is received "late"—meaning that it contains stale information that would mislead the control panel—then it will be ignored. As described above, this may happen for example if a door is opened then quickly closed, such that a "door open" group of messages is sent by a transmitter, then a "door closed" group of messages sent by the transmitter immediately thereafter. (It is noted that messages are often sent in message groups, such as a sextet, which improves reliability and increases the chances of a successful transmission, as well known in the art). Since one of the messages from the "door open" group may arrive at the control panel after one of the messages from the "door closed" group (due to processing delays by distant receivers, dropped bits, etc.), the control panel will determine with this invention that the sequence count from the "door open" message is less than that of the "door closed" message and ignore it accordingly. This invention thereby allows the control panel to determine if a message received from a certain transmitter may be out of sequence due to delays in reception, processing, etc. by one of the receivers in the system.

It is noted that at some point, the sequence count must wrap around to zero. In the preferred embodiment that uses an eight bit sequence count, the count sequence will be 0, 1, 2, 3, 4, 5, 6, 7, . . . 254, 255, 0, 1, 2, 3, 4, etc. The processing logic is programmed to recognize that a count of 0 is considered to be greater than a count of 255, so that when 0 is detected after a 255, the control will not erroneously regard that as an out of sequence transmission.

It is also noted that the preferred embodiment will provide for erasing the sequence count data from the table on a periodic basis, for example every minute. After the sequence count data is erased, then the new sequence count received from a data transmission will be stored and utilized as previously described. This will eliminate stale information and assist in resynchronizing sequence counts if necessary, for example if a transmitting device is replaced and the sequence count must be synchronized.

What is claimed is:

1. A method of transmitting a message from a security device to a receiving device comprising the steps of:
    a. forming, the security device, a two-part data message comprising a first message part and a second message part, wherein the security device transmitting the message through a wireless link,
        i. the first message part comprising
            1. a preamble portion,
            2. an identification number portion that uniquely identifies the security device,
            3. a status portion that comprises status data indicative of the status of the security device, and
            4. a cyclic redundancy check portion that contains cyclic redundancy check data based on a cyclic redundancy check function performed on the identification number portion and the status portion, and
        ii. the second message part comprising a first sequence count and a second sequence count, the second sequence count has the same information as the first sequence count but is the logical inverse thereof where the first and second sequence counts are analyzed with respect to each other to ensure data integrity of the two-part data message;
    b. encoding within encoding circuitry the first message part in a first encoding format;
    c. encoding the second message part in a second encoding format different from the first encoding format;
    d. modulating a carrier signal with the encoded first message part and the encoded second message part; and
    e. wirelessly transmitting the modulated carrier signal to the receiving device.

2. The method of claim 1 wherein the first encoding format is a return-to-zero (RZ) format.

3. The method of claim 2 wherein the RZ format is the Manchester format.

4. The method of claim 2 wherein the second encoding format is a non-return-to-zero (NRZ) format.

5. The method of claim 1 wherein the second encoding format is a return-to-zero (RZ) format.

6. The method of claim 5 wherein the RZ format is the Manchester format.

7. The method of claim 5 wherein the first encoding format is a non-return-to-zero (NRZ) format.

8. The method of claim 1 further comprising the steps of:
    determining if any of the status bits in the status portion of first message part of the message have changed from a previously transmitted message;
    if any of the status bits have changed, then incrementing the sequence count from the previously transmitted message, and
    if none of the status bits have changed, then using the same sequence count as in the previously transmitted message.

9. A method of operating a security system comprising the steps of:
    a. forming, at a transmitter, a two-part data message comprising a first message part and a second message part,
        i. the first message part comprising
            1. a preamble portion,
            2. an identification number portion that uniquely identifies the security device, 3. a status portion that comprises status data indicative of the status of the security device, and
4. a cyclic redundancy check portion that contains cyclic redundancy check data based on a cyclic redundancy check function performed on the identification number portion and the status portion, and ii. the second message part comprising a first sequence count and a second sequence count, the second sequence count has the same information as the first sequence count but is the logical inverse thereof where the first and second sequence counts are analyzed with respect to each other to ensure data integrity of the two-part data message;

b. encoding the first message part in a first encoding format;
c. encoding the second message part in a second encoding format different from the first encoding format;
d. modulating a carrier signal with the encoded first message part and the encoded second message part;
e. wirelessly transmitting the modulated carrier signal;
f. wirelessly receiving, at a receiving device, the modulated carrier signal;
g. demodulating the received modulated carrier signal;
h. decoding the first message part using the first encoding format to obtain the preamble portion, the identification number portion, the status portion, and the CRC portion;
i. decoding the second message part using the second encoding format to obtain the first sequence count; and
j. processing the message by the steps of:
  i. retrieving from memory a previous sequence count associated with the identification number;
  ii. comparing the first sequence count from the message with the previous sequence count from memory;
    1. if the first sequence count from the message is less than or equal to the previous sequence count, then ignoring the message; and
    2. if the first sequence count from the message is not less than or equal to the previous sequence count, then processing the message and replacing the previous sequence count in memory with the first sequence count from the message.

10. The method of claim 9 further comprising the steps of:
determining if any of the status bits in the status portion of first message part of the message have changed from a previously transmitted message;
if any of the status bits have changed, then incrementing the sequence count from the previously transmitted message, and
if none of the status bits have changed, then using the same sequence count as in the previously transmitted message.

11. A wirelessly security device for use in a security system comprising:
a. processing circuitry adapted to form a two-part data message comprising a first message part and a second message part, wherein the security device transmitting the message through a wireless link,
  i. the first message part comprising
    1. a preamble portion,
    2. an identification number portion that uniquely identifies the security device,
    3. a status portion that comprises status data indicative of the status of the security device, and
    4. a cyclic redundancy check portion that contains cyclic redundancy check data based on a cyclic redundancy check function performed on the identification number portion and the status portion, and
  ii. the second message part comprising a first sequence count and a second sequence count, the second sequence count has the same information as the first sequence count but is the logical inverse thereof where the first and second sequence counts are analyzed with respect to each other to ensure data integrity of the two-part data message;
b. first encoding circuitry adapted to encode the first message part in a first encoding format;
c. second encoding circuitry adapted to encode the second message part in a second encoding format different from the first encoding format;
d. data transmission circuitry adapted to modulate a carrier signal with the encoded first message part and the encoded second message part and wirelessly transmit the modulated carrier signal.

12. The security device of claim 11 wherein the first encoding format is a return-to-zero (RZ) format.

13. The security device of claim 12 wherein the RZ format is the Manchester format.

14. The security device of claim 12 wherein the second encoding format is a non-return-to-zero (NRZ) format.

15. The security device of claim 11 wherein the second encoding format is a return-to-zero (RZ) format.

16. The security device of claim 15 wherein the RZ format is the Manchester format.

17. The security device of claim 15 wherein the first encoding format is a non-return-to-zero (NRZ) format.

18. The security device of claim 11 wherein the processing circuitry is further adapted to:
determine if any of the status bits in the status portion of first message part of the message have changed from a previously transmitted message;
if any of the status bits have changed, then increment the sequence count from the previously transmitted message, and
if none of the status bits have changed, then using the same sequence count as in the previously transmitted message.

19. A security system comprising:
A. a wirelessly security device comprising:
  a. first processing circuitry adapted to form a two-part data message comprising a first message part and a second message part,
    i. the first message part comprising
      1. a preamble portion,
      2. an identification number portion that uniquely identifies the security device,
      3. a status portion that comprises status data indicative of the status of the security device, and
      4. a cyclic redundancy check portion that contains cyclic redundancy check data based on a cyclic redundancy check function performed on the identification number portion and the status portion, and
    ii. the second message part comprising a first sequence count and a second sequence count, the second sequence count has the same information as the first sequence count but is the logical inverse thereof where the first and second sequence counts are analyzed with respect to each other to ensure data integrity of the two-part data message;
  b. first encoding circuitry adapted to encode the first message part in a first encoding format;

c. second encoding circuitry adapted to encode the second message part in a second encoding format different from the first encoding format;
d. data transmission circuitry adapted to modulate a carrier signal with the encoded first message part and the encoded second message part and wirelessly transmit the modulated carrier signal; and B. a receiving device comprising:
a. data receiving circuitry adapted to wirelessly receive and demodulate the modulated carrier signal;
b. first decoding circuitry adapted to decode the first message part using the first encoding format to obtain the preamble portion, the identification number portion, the status portion, and the CRC portion;
b. second decoding circuitry adapted to decode the second message part using the second encoding format to obtain the first sequence count; and
c. second processing circuitry adapted to:
  i. retrieve from memory a previous sequence count associated with the identification number;
  ii. compare the first sequence count from the message with the previous sequence count from memory;
    1. if the first sequence count from the message is less than or equal to the previous sequence count, then ignore the message; and
    2. if the first sequence count from the message is not less than or equal to the previous sequence count, then process the message and replace the previous sequence count in memory with the first sequence count from the message.

20. The security system of claim 19 wherein the first processing circuitry is further adapted to:
determine if any of the status bits in the status portion of first message part of the message have changed from a previously transmitted message;
if any of the status bits have changed, then increment the sequence count from the previously transmitted message, and
if none of the status bits have changed, then use the same sequence count as in the previously transmitted message.

* * * * *